(12) United States Patent
Matsumoto et al.

(10) Patent No.: US 8,526,199 B2
(45) Date of Patent: Sep. 3, 2013

(54) SEMICONDUCTOR DEVICE

(75) Inventors: Manabu Matsumoto, Chiyoda-ku (JP); Masafumi Matsumoto, Chiyoda-ku (JP); Hideki Tsukamoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 212 days.

(21) Appl. No.: 13/053,748

(22) Filed: Mar. 22, 2011

(65) Prior Publication Data

US 2011/0273861 A1   Nov. 10, 2011

(30) Foreign Application Priority Data

May 7, 2010   (JP) .................................. 2010-107415

(51) Int. Cl.
*H05K 7/00* (2006.01)
*H01L 23/04* (2006.01)

(52) U.S. Cl.
CPC ..................................... *H01L 23/04* (2013.01)
USPC ........................................... 361/820; 361/783

(58) Field of Classification Search
CPC ....................................................... H01L 23/04
USPC ................................ 361/820, 525, 783, 760
See application file for complete search history.

(56) References Cited

U.S. PATENT DOCUMENTS

| | | | |
|---|---|---|---|
| 4,970,576 A | 11/1990 | Neidig et al. | |
| 7,539,027 B2 * | 5/2009 | Callahan et al. | 361/803 |
| 7,652,358 B2 * | 1/2010 | Minakawa et al. | 257/675 |
| 7,848,112 B2 | 12/2010 | Matsumoto | |
| 2006/0126312 A1 | 6/2006 | Kroneder | |
| 2008/0001278 A1 * | 1/2008 | Matsumoto | 257/690 |
| 2010/0097775 A1 * | 4/2010 | Kashiwazaki et al. | 361/783 |
| 2011/0044012 A1 | 2/2011 | Matsumoto | |
| 2011/0134619 A1 * | 6/2011 | Lin | 361/783 |

FOREIGN PATENT DOCUMENTS

| | | |
|---|---|---|
| CN | 101097898 A | 1/2008 |
| DE | 101 00 460 A1 | 7/2002 |
| DE | 101 20 402 A1 | 11/2002 |
| DE | 102 58 570 A1 | 7/2004 |
| EP | 0 513 410 A1 | 11/1992 |

(Continued)

OTHER PUBLICATIONS

Japanese Office Action Issued Nov. 13, 2012 in Patent Application No. 2010-107415 (with English translation).

(Continued)

*Primary Examiner* — Yuriy Semenenko
(74) *Attorney, Agent, or Firm* — Oblon, Spivak, McClelland, Maier & Neustadt, L.L.P.

(57) ABSTRACT

A semiconductor device includes a semiconductor mounting substrate, a mother case having an opening and housing the semiconductor mounting substrate, a plurality of securing members provided along a rim of the mother case, a screw terminal, and a lid member. The screw terminal has a flat plate portion, an insertion portion extending from the flat plate portion, and a terminal bottom portion, is secured to the securing members by insertion of the insertion portion between adjacent securing members, and is electrically connected to the semiconductor mounting substrate on the terminal bottom portion side. The lid member closes the opening with the screw terminal secured to the securing members. The screw terminal is bent such that the flat plate portion faces an upper surface of the lid member closing the opening. The semiconductor device that can achieve reduction in size of the entire device is obtained.

7 Claims, 9 Drawing Sheets

(56) References Cited

FOREIGN PATENT DOCUMENTS

| | | |
|---|---|---|
| JP | 63-306651 A | 12/1988 |
| JP | 4-131945 | 12/1992 |
| JP | 7-263623 | 10/1995 |
| JP | 9-283681 A | 10/1997 |
| JP | 2005-277012 A | 10/2005 |
| JP | 2008-10656 | 1/2008 |

OTHER PUBLICATIONS

German Office Action Issued Oct. 19, 2012 in Patent Application No. 10 2011 075 154.8 (with English translation).

Combined Office Action and Search Report issued Dec. 20, 2012 in Chinese Patent Application No. 201110116718.3 with English language translation.

* cited by examiner

SEMICONDUCTOR DEVICE

BACKGROUND OF THE INVENTION

1. Field of the Invention

The present invention relates to a semiconductor device, and particularly, to a semiconductor device in which a securing position of a screw terminal serving as an electrode can be freely changed.

2. Description of the Background Art

Semiconductor devices used to drive an inverter and the like have configurations such as CIB (Converter-Inverter-Brake), 7in1, 6in1, or 2in1. CIB refers to a package incorporating a converter, a brake and a six-element inverter. 7in1 refers to a package incorporating a six-element inverter and a brake. 6in1 refers to a package incorporating a six-element inverter. 2in1 refers to a package incorporating a two-element inverter.

These semiconductor devices are different from one another in terms of a circuit configuration (an internal circuit, a rating, a specification and the like) and the like. These semiconductor devices are different from one another in terms of shape and arrangement of terminals, due to differences in circuit configuration and the like.

Japanese Patent Laying-Open No. 2008-010656 discloses a semiconductor device that can adapt to variation in shape and arrangement of terminals attributable to differences in circuit configuration and the like of the semiconductor devices.

Japanese Patent Laying-Open No. 07-263623 discloses a semiconductor device having a cover body that can adapt to a change in positions of lead-out conductors and an increase or decrease in the number of the lead-out conductors.

Japanese Utility Model Laying-Open No. 04-131945 discloses a semiconductor device that can prevent falling off and loosening of a nut inserted into a nut insertion hole in a case lid.

Japanese Patent Laying-Open No. 2008-010656 describes that a screw terminal can be secured at a desired position in a rim of a mother case. The screw terminal secured to the rim of the mother case and a prescribed external terminal connected to this screw terminal are, however, connected outside the mother case in a plan view. The screw terminal itself also protrudes outward from the mother case in a plan view. The size of the entire semiconductor device in this publication is large.

SUMMARY OF THE INVENTION

An object of the present invention is to provide a semiconductor device that can achieve reduction in size of the entire device.

A semiconductor device according to one aspect of the present invention includes a semiconductor mounting substrate, a mother case, a plurality of securing members, a screw terminal, and a lid member. The mother case has an opening and houses the semiconductor mounting substrate. The plurality of securing members are provided along a rim of the mother case constituting the opening.

The screw terminal has a flat plate portion, an insertion portion extending from the flat plate portion, and a terminal bottom portion located opposite to the flat plate portion with the insertion portion interposed between the terminal bottom portion and the flat plate portion. The screw terminal is secured to the securing members by insertion of the insertion portion between adjacent securing members. The screw terminal is electrically connected to the semiconductor mounting substrate on the terminal bottom portion side. The lid member is capable of closing the opening with the screw terminal secured to the securing members. The screw terminal secured to the securing members is bent such that the flat plate portion faces an upper surface of the lid member closing the opening.

A semiconductor device according to another aspect of the present invention includes a semiconductor mounting substrate, a mother case, a plurality of securing members, a block, a screw terminal, and a lid member. The mother case has an opening and houses the semiconductor mounting substrate. The plurality of securing members are provided along a rim of the mother case constituting the opening. The block has an insertion portion and is secured to the securing members by insertion of the insertion portion between adjacent securing members.

The screw terminal is configured to include a flat plate portion and a plurality of terminal bottom portions extending from the flat plate portion. The screw terminal is provided to pass through the block and held by the block. The screw terminal is electrically connected to the semiconductor mounting substrate on the plurality of terminal bottom portions side. The lid member is capable of closing the opening with the block secured to the securing members. The screw terminal is bent such that the flat plate portion faces an upper surface of the lid member closing the opening, with the block secured to the securing members.

According to the present invention, the semiconductor device that can achieve reduction in size of the entire device can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device according to each embodiment based on the present invention will be described hereinafter with reference to the drawings. In each embodiment described in the following, descriptions of numbers, amounts and the like are not intended to limit the scope of the invention unless otherwise specified. In each embodiment described in the following, the same or corresponding components are denoted with the same reference numerals, and the same description will not be repeated.

First Embodiment

A semiconductor device 1A according to the present embodiment will be described with reference to FIGS. 1 and 2.

Figure 2:
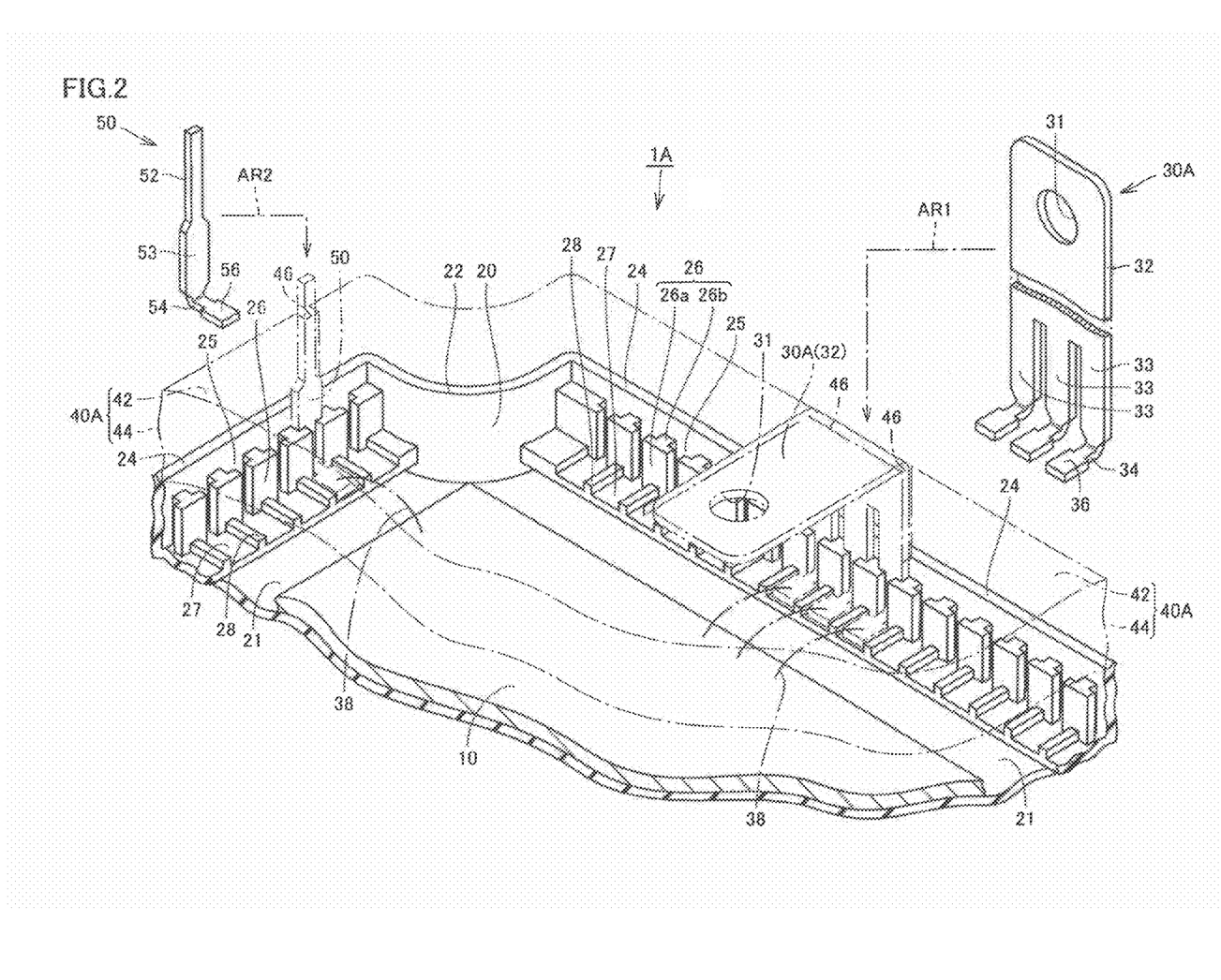
FIG. 2 is an enlarged perspective view schematically showing a region surrounded by line II in FIG. 1.

Referring mainly to FIG. 2, semiconductor device 1A includes a semiconductor mounting substrate 10, a mother case 20, a plurality of securing members 26, a screw terminal 30A, and a lid member 40A.

Semiconductor mounting substrate 10 is formed, for example, of an insulating substrate made of ceramic and the like, a wiring pattern of copper foil and the like formed on a surface of this substrate, and a semiconductor element fixed onto this wiring pattern.

Figure 1:
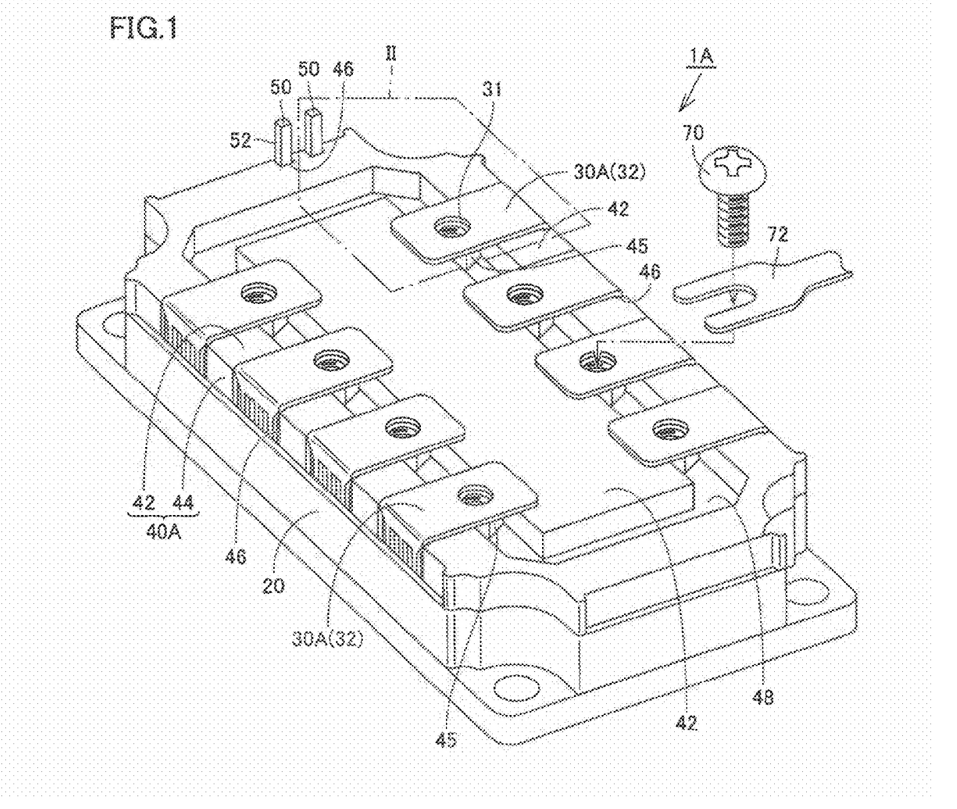
FIG. 1 is a perspective view of a semiconductor device according to a first embodiment.

Mother case 20 is configured to have a substantially rectangular shape in a plan view (see FIG. 1). Mother case 20 is configured in a form of a container and has an opening 22 open to the upper side in FIGS. 1 and 2. Semiconductor mounting substrate 10 is secured onto a bottom portion 21 of mother case 20 and is housed in mother case 20. A base plate (not shown) of copper, copper alloy or the like that is excellent in heat dissipation may be interposed between bottom portion 21 of mother case 20 and semiconductor mounting substrate 10.

Securing members 26 are provided at equal spacings along a rim 24 of mother case 20 constituting opening 22. Securing members 26 in the present embodiment are formed along substantially all of four rims 24 of mother case 20. Securing members 26 may be formed along only one to three rims 24 out of four rims 24, for example.

Securing member 26 is formed of a flange portion 26a and a connecting portion 26b. Flange portion 26a and connecting portion 26b are both configured to have a substantially rectangular parallelepiped shape. Both flange portions 26a and connecting portions 26b are also aligned at equal spacings along rim 24 of mother case 20.

Flange portion 26a faces rim 24 of mother case 20 and extends in the direction parallel to rim 24 of mother case 20. A prescribed spacing is provided between flange portion 26a and rim 24 of mother case 20. Connecting portion 26b extends from a substantially central portion of flange portion 26a toward rim 24 of mother case 20. Connecting portion 26b connects the substantially central portion of flange portion 26a and rim 24 of mother case 20. Flange portion 26a and connecting portion 26b may be molded integrally with rim 24 of mother case 20.

A thin portion 27 and a thick portion 28 are provided on a portion of bottom portion 21 of mother case 20 located on the inner side (on the semiconductor mounting substrate 10 side) than securing member 26. Thin portion 27 and thick portion 28 are alternately arranged along rim 24 of mother case 20.

Thin portion 27 extends toward the opposite side of rim 24 such that a surface of thin portion 27 is parallel to bottom portion 21 of mother case 20. Thin portion 27 is provided such that the surface of thin portion 27 is higher than bottom portion 21 of mother case 20.

Thick portion 28 is located opposite to connecting portion 26b with the substantially central portion of flange portion 26a interposed therebetween. Thick portion 28 is provided to project between adjacent thin portions 27.

Mother case 20, securing member 26 (flange portion 26a and connecting portion 26b), thin portion 27, and thick portion 28 may be made of a thermoplastic resin and the like. The thermoplastic resin and the like includes, for example, PPS (polyphenylene sulfide), PBT (polybutylene terephthalate) or the like.

A securing position 25 where an insertion portion 33 of screw terminal 30A that will be described next is inserted is defined in a space between adjacent securing members 26.

Screw terminal 30A has a flat plate portion 32, insertion portion 33 and a terminal bottom portion 36. Flat plate portion 32 is configured to have a flat plate shape. An opening 31 is provided substantially in the center of flat plate portion 32. Although the details will be provided later with reference to FIG. 1, screw terminal 30A is bent such that flat plate portion 32 faces an upper surface 42 of lid member 40A which closes opening 22 of mother case 20. Therefore, opening 31 of screw terminal 30A is provided to be coaxial with a nut 45 provided at upper surface 42 of lid member 40A, when screw terminal 30A is bent.

Insertion portion 33 is configured to have a substantially rectangular parallelepiped shape so as to correspond to the shape of securing position 25. Insertion portion 33 extends to branch from flat plate portion 32 into three parts. Insertion portion 33 and flat plate portion 32 are located on a substantially identical plane.

A bent portion 34 is provided at a lower end of insertion portion 33. Bent portion 34 is configured to be narrower than insertion portion 33 and terminal bottom portion 36 that will be described next so as to correspond to the width of a gap between adjacent flange portions 26a.

Terminal bottom portion 36 is located opposite to flat plate portion 32 with insertion portion 33 (and bent portion 34) interposed therebetween. Terminal bottom portion 36 extends from bent portion 34 in the direction perpendicular to insertion portion 33. Terminal bottom portion 36 is configured to have a substantially rectangular parallelepiped shape so as to correspond to thin portion 27.

As shown by an arrow AR1, insertion portion 33 of screw terminal 30A is inserted into (pressed into) arbitrary securing position 25 from above. Insertion portion 33 engages with adjacent securing members 26, thereby securing screw terminal 30A to rim 24 of mother case 20.

Thick portion 28 may be melted, with terminal bottom portion 36 of screw terminal 30A arranged on thin portion 27 of mother case 20. As a result of melting of thick portion 28, a gap between terminal bottom portion 36 and thin portion 27 as well as a gap between terminal bottom portion 36 and thick portion 28 are filled with the resin. As a result of melting of thick portion 28, screw terminal 30A is secured to mother case 20 more firmly. Thick portion 28 may be melted by direct heating or by using ultrasonic waves.

Terminal bottom portion 36 of screw terminal 30A and semiconductor mounting substrate 10 are connected by a wire 38, and thus, screw terminal 30A is electrically connected to semiconductor mounting substrate 10.

Semiconductor device 1A according to the present embodiment may further include a pin terminal 50. Pin terminal 50 has a projecting portion 52, an insertion portion 53 and a terminal bottom portion 56. Projecting portion 52 is configured to have a bar shape. Insertion portion 53 is configured to have a substantially rectangular parallelepiped shape so as to correspond to the shape of securing position 25. Insertion portion 53 extends from projecting portion 52. Insertion portion 53 and projecting portion 52 are located on a substantially identical plane.

A bent portion 54 is provided at a lower end of insertion portion 53. Bent portion 54 is configured to be narrower than insertion portion 53 and terminal bottom portion 56 that will be described next so as to correspond to the width of the gap between adjacent flange portions 26a.

Terminal bottom portion 56 is located opposite to projecting portion 52 with insertion portion 53 (and bent portion 54) interposed therebetween. Terminal bottom portion 56 extends from bent portion 54 in the direction perpendicular to insertion portion 53. Terminal bottom portion 56 is configured to have a substantially rectangular parallelepiped shape so as to correspond to thin portion 27.

As shown by an arrow AR2, insertion portion 53 of pin terminal 50 is inserted into (pressed into) arbitrary securing position 25 from above. Insertion portion 53 engages with adjacent securing members 26, thereby securing pin terminal 50 to rim 24 of mother case 20.

Thick portion 28 may be melted, with terminal bottom portion 56 of pin terminal 50 arranged on thin portion 27 of mother case 20. As a result of melting of thick portion 28, a gap between terminal bottom portion 56 and thin portion 27 as well as a gap between terminal bottom portion 56 and thick portion 28 are filled with the resin. As a result of melting of thick portion 28, pin terminal 50 is secured to mother case 20 more firmly.

Terminal bottom portion 56 of pin terminal 50 and semiconductor mounting substrate 10 are connected by wire 38, and thus, pin terminal 50 is electrically connected to semiconductor mounting substrate 10.

Referring mainly to FIG. 1, lid member 40A is configured to have a substantially rectangular shape in a plan view. Lid member 40A is configured in a form of a cap and has upper surface 42 and a side surface 44. The shape of side surface 44 of lid member 40A corresponds to the shape of rim 24 (see FIG. 2) of mother case 20. Lid member 40A closes opening 22 of mother case 20, and thus, semiconductor mounting substrate 10 is sealed in lid member 40A and mother case 20. The outer shape of lid member 40A in a plan view may be identical to the outer shape of mother case 20. The outer shape of lid member 40A in a plan view may be smaller than the outer shape of mother case 20.

An accommodating groove 48 recessed in the thickness direction of lid member 40A is provided in upper surface 42 of lid member 40A annularly in a plan view. Accommodating groove 48 accommodates nut 45 having a hexagonal shape in a plan view, for example.

A notch 46 extending in the thickness direction of lid member 40A is provided in side surface 44 of lid member 40A. Notch 46 is provided to be recessed in the thickness direction of side surface 44 from side surface 44 of lid member 40A. Notch 46 is provided corresponding to a desired position where screw terminal 30A and pin terminal 50 are secured to mother case 20.

In the present embodiment, four notches 46 are provided at equal spacings in each side surface 44 of lid member 40A on the longer side, corresponding to the position where screw terminal 30A is secured. Two notches 46 are provided in one side surface 44 of lid member 40A on the shorter side, corresponding to the position where pin terminal 50 is secured.

Since notch 46 is provided in lid member 40A, lid member 40A can close opening 22 of mother case 20 with screw terminal 30A and pin terminal 50 secured to rim 24 of mother case 20.

Screw terminal 30A secured to rim 24 of mother case 20 is bent substantially at a right angle such that flat plate portion 32 faces upper surface 42 of lid member 40A which closes opening 22. Opening 31 of flat plate portion 32 of screw terminal 30A and nut 45 are coaxially arranged.

Functions and Effects

In semiconductor device 1A configured as described above, a prescribed external terminal 72 is arranged on screw terminal 30A. A screwing member 70 such as a screw or a bolt is screwed into nut 45 through opening 31 of screw terminal 30A. External terminal 72 is secured to screw terminal 30A, and thus, external terminal 72 is electrically connected to semiconductor mounting substrate 10. In addition, another prescribed external terminal (not shown) is connected to pin terminal 50, and thus, another external terminal is electrically connected to semiconductor mounting substrate 10.

According to semiconductor device 1A, screw terminal 30A and pin terminal 50 are secured to rim 24 of mother case 20. Screw terminal 30A is bent substantially at a right angle to face upper surface 42 of lid member 40A.

External terminal 72 is secured to screw terminal 30A on upper surface 42 of lid member 40A. The position where external terminal 72 is secured to screw terminal 30A is on the inner side than rim 24 of mother case 20 in a plan view. In the present embodiment, the position of screw terminal 30A itself is also on the inner side than rim 24 of mother case 20 in a plan view. According to semiconductor device 1A, external terminal 72 is secured on upper surface 42 of lid member 40A, and screw terminal 30A does not protrude outward from mother case 20. According to semiconductor device 1A, the size of the entire device can be made smaller than that of the semiconductor device in Japanese Patent Laying-Open No. 2008-010656 described at the beginning.

According to semiconductor device 1A, screw terminal 30A is arranged along securing member 26 provided along the rim of mother case 20, notch 46 provided in side surface 44 of lid member 40A, and upper surface 42 of lid member 40A. In other words, screw terminal 30A is arranged by making full use of the upper surface (outer surface) of lid member 40A. Since screw terminal 30A does not protrude to a space formed within mother case 20 and lid member 40A, the flexibility of layout in mother case 20 can be enhanced.

According to semiconductor device 1A, screw terminal 30A and pin terminal 50 can be secured at desired securing position 25 in rim 24 of mother case 20. Even when arrangement of the terminals varies due to differences in circuit configuration such as CIB, 7in1, 6in1, or 2in1, flexible adaptation to the variation is possible. Semiconductor device 1A can form various packages. According to semiconductor device 1A, the cost of making a prototype of a package or manufacturing a die to mass-produce the package can be reduced.

Although the example has been described in the present embodiment, where three insertion portions 33 extend to branch from one flat plate portion 32 in screw terminal 30A, one or a plurality of insertion portions 33 may extend from one flat plate portion 32.

Although the example has been described in the present embodiment, where mother case 20 has a substantially rectangular shape in a plan view, mother case 20 may have, for example, a circular shape in a plan view. Similarly, lid member 40A may also have, for example, a circular shape in a plan view.

Modification of First Embodiment

Figure 3:
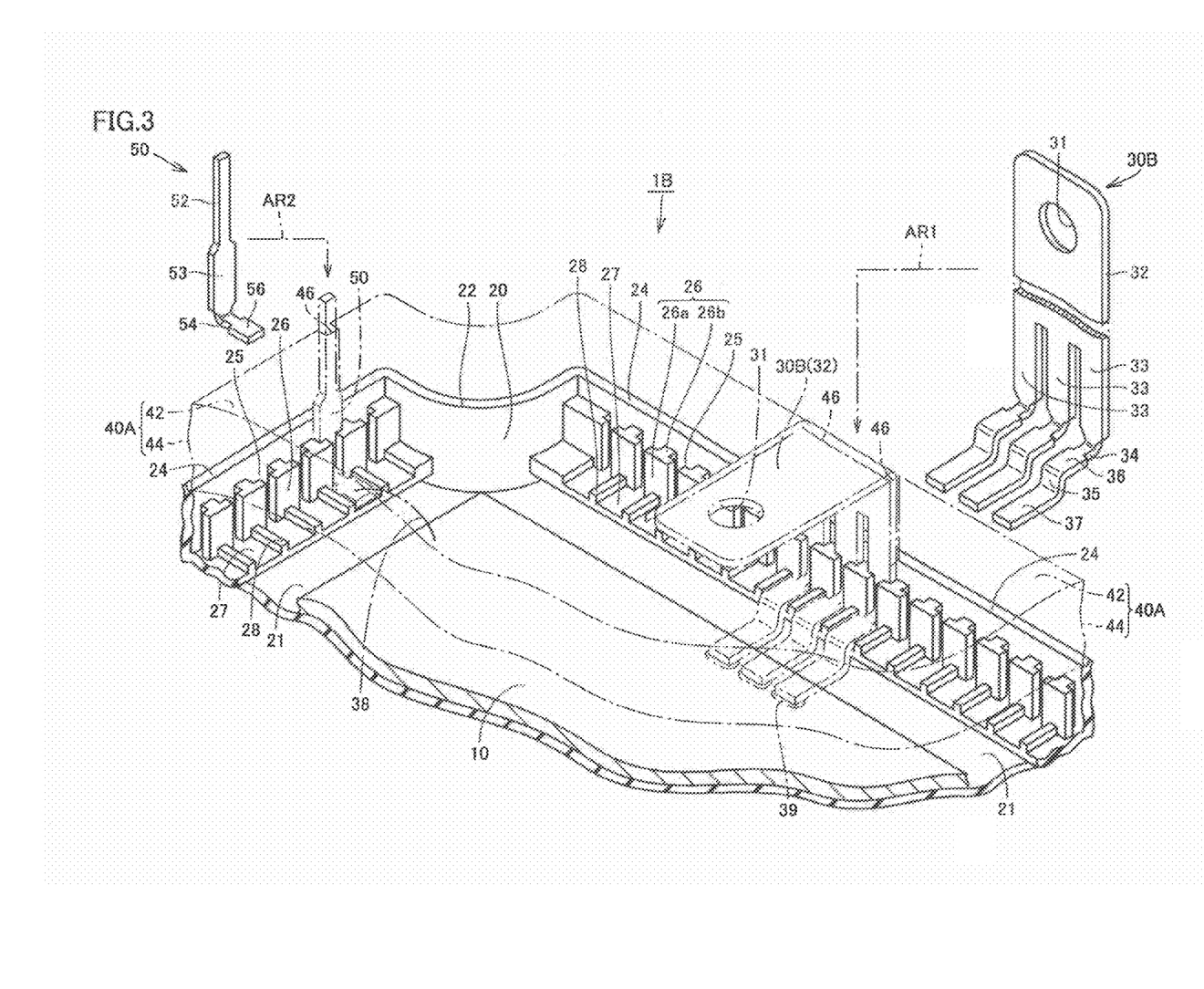
FIG. 3 is an enlarged perspective view schematically showing a part of a semiconductor device according to a modification of the first embodiment.

A semiconductor device 1B according to a modification of the first embodiment will be described with reference to FIG. 3. FIG. 3 corresponds to FIG. 2 in the above first embodiment. Semiconductor device 1B is different from semiconductor device 1A according to the above first embodiment in terms of the following, and the former is substantially similar to the latter except for the following.

A screw terminal 30B in semiconductor device 1B has an extending portion 37 extending from terminal bottom portion 36. Extending portion 37 extends from terminal bottom portion 36 toward semiconductor mounting substrate 10, with screw terminal 30B secured at securing position 25 (with terminal bottom portion 36 arranged on thin portion 27). Extending portion 37 reaches a vicinity of a prescribed pad (not shown) on semiconductor mounting substrate 10.

A bent portion 35 may be provided between a tip of terminal bottom portion 36 and extending portion 37. Bent portion 35 extends to hang slightly forward (in the direction in which screw terminal 30B is bent) from the tip of terminal bottom portion 36. Extending portion 37 is connected to a tip of bent portion 35. Terminal bottom portion 36, bent portion 35 and extending portion 37 may have a substantially identical width.

In semiconductor device 1B, extending portion 37 and semiconductor mounting substrate 10 are connected by a solder 39, and thus, screw terminal 30B is electrically connected to semiconductor mounting substrate 10.

According to semiconductor device 1B, screw terminal 30B is electrically connected to semiconductor mounting substrate 10 by soldering. Therefore, a larger current can flow through semiconductor mounting substrate 10 in semiconductor device 1B than in semiconductor device 1A according to the above first embodiment.

Second Embodiment

Figure 4:
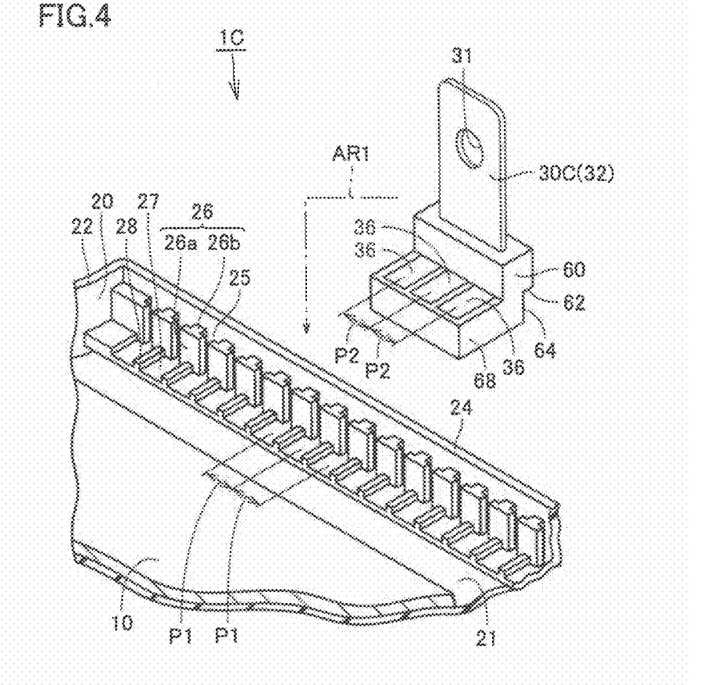
FIG. 4 is an enlarged perspective view schematically showing a part of a semiconductor device according to a second embodiment.

A semiconductor device 1C according to the present embodiment will be described with reference to FIGS. 4 to 6. FIG. 4 corresponds to FIG. 2 in the above first embodiment. In FIG. 4, the lid member is not shown. In FIG. 6, mother case 20 is shown additionally. Semiconductor device 1C is different from semiconductor device 1A according to the above first embodiment in terms of the following, and the former is substantially similar to the latter except for the following.

Referring to FIG. 4, semiconductor device IC includes semiconductor mounting substrate 10, mother case 20, the plurality of securing members 26, a screw terminal 30C, a block 60, and a lid member (not shown).

Semiconductor mounting substrate 10, mother case 20, the plurality of securing members 26, and the lid member are configured in a substantially similar manner to semiconductor mounting substrate 10, mother case 20, the plurality of securing members 26, and lid member 40A in semiconductor device 1A according to the above first embodiment, respectively. Although the details will be provided later, block 60 is secured to rim 24 of mother case 20 together with screw terminal 30C, as shown by arrow AR1 (see FIGS. 4 and 6).

Screw terminal 30C is configured to include flat plate portion 32 and a plurality of terminal bottom portions 36. Screw terminal 30C is configured to have a substantially L-shaped cross section as a whole (see FIG. 6).

Flat plate portion 32 is configured to have a flat plate shape. Opening 31 is provided substantially in the center of flat plate portion 32. Similarly to screw terminal 30A in semiconductor device 1A according to the above first embodiment, screw terminal 30C is bent such that flat plate portion 32 faces an upper surface of the lid member which closes opening 22 of mother case 20. Therefore, opening 31 of screw terminal 30C is provided to be coaxial with a nut provided at the upper surface of the lid member, when screw terminal 30C is bent.

Terminal bottom portion 36 extends from a lower end of flat plate portion 32 in the direction substantially perpendicular to flat plate portion 32. In the present embodiment, three terminal bottom portions 36 extend in the substantially parallel direction to branch from flat plate portion 32. Terminal bottom portions 36 are aligned at a spacing P2. Screw terminal 30C is provided to pass through block 60 that will be described next. Terminal bottom portion 36 is exposed at a surface of block 60.

Figure 5:
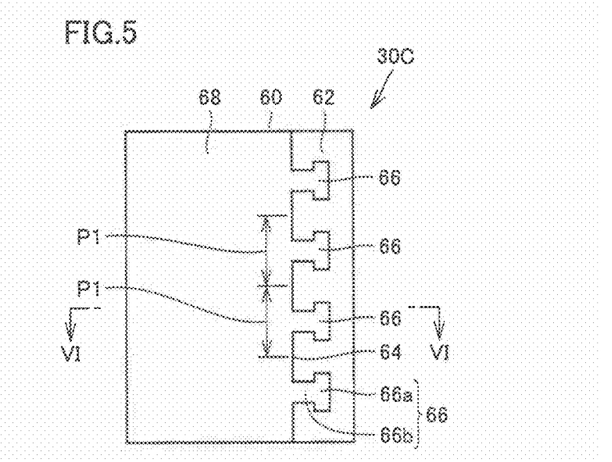
FIG. 5 is a bottom view of a screw terminal of the semiconductor device according to the second embodiment.
Figure 6:
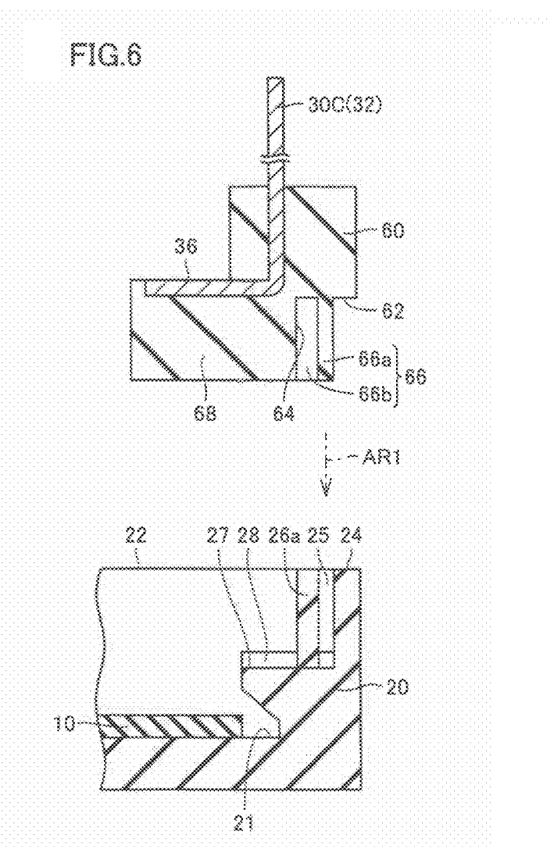
FIG. 6 is a cross-sectional view taken along line VI-VI in FIG. 5.

Referring mainly to FIGS. 5 and 6, block 60 has an abutting portion 62, an end face portion 64, an insertion portion 66, and a protruding portion 68. Block 60 is made of a nonconductive material (for example, a resin and the like).

Abutting portion 62 and end face portion 64 are located on the lower side on the rear surface side (on the right side in FIG. 6) of block 60. A surface of abutting portion 62 and a surface of end face portion 64 are each formed to have a planar shape, and the surface of abutting portion 62 is substantially orthogonal to the surface of end face portion 64.

The surface of abutting portion 62 and the surface of end face portion 64 have a cross section of substantially inverted L shape. In block 60, this portion having the cross section of substantially inverted L shape can engage with rim 24 of mother case 20.

The width of abutting portion 62 of block 60 (in the horizontal direction in FIG. 6) may be smaller than the thickness of rim 24 of mother case 20. With this configuration, block 60 is located on the inner side than rim 24 (outer edge) of mother case 20 in a plan view, with block 60 engaging with rim 24 of mother case 20.

Insertion portion 66 is provided to hang from abutting portion 62 and to project from end face portion 64. Insertion portions 66 are aligned at equal spacings along end face portion 64. Referring to FIG. 5, a spacing P1 between adjacent insertion portions 66 (connecting portions 66b that will be described next) is equal to a spacing P1 (see FIG. 4) between adjacent securing members 26. Although four insertion portions 66 are provided in the present embodiment, one insertion portion 66 may be provided.

Insertion portion 66 is formed of a flange portion 66a and connecting portion 66b. Flange portion 66a and connecting portion 66b are both configured to have a substantially rectangular parallelepiped shape. Both flange portions 66a and connecting portions 66b are aligned at equal spacings along end face portion 64.

Flange portion 66a faces end face portion 64 and extends in the direction parallel to end face portion 64. A prescribed spacing is provided between flange portion 66a and end face portion 64. Connecting portion 66b extends from a substantially central portion of flange portion 66a toward end face portion 64. Connecting portion 66b connects the substantially central portion of flange portion 66a and end face portion 64. Flange portion 66a and connecting portion 66b may be molded integrally.

Protruding portion 68 is configured to have a substantially rectangular parallelepiped shape and is located on the lower side on the front surface side (on the left side in FIG. 6) of block 60. A part of an upper surface of protruding portion 68 is open. A bottom surface of protruding portion 68 may be provided with a groove (not shown) that can engage with thin portion 27 and thick portion 28 when insertion portion 66 of block 60 is inserted into securing position 25 from above.

Screw terminal 30C is arranged such that terminal bottom portion 36 is exposed at the opening in the upper surface of protruding portion 68. In screw terminal 30C, block 60 covers the perimeter of flat plate portion 32 on the lower end side. With this configuration, block 60 holds screw terminal 30C. Flat plate portion 32 of screw terminal 30C may be located on the front surface side (on the left side in FIG. 6) than end face portion 64, with the perimeter thereof on the lower end side covered with block 60.

In screw terminal 30C and block 60, insertion portion 66 of block 60 is inserted into (pressed into) arbitrary securing position 25 from above as shown by arrow AR1 (see FIGS. 4 and 6). Insertion portion 66 engages with adjacent securing members 26, and thus, screw terminal 30C and block 60 are secured to rim 24 of mother case 20.

Terminal bottom portion 36 of screw terminal 30C and semiconductor mounting substrate 10 are connected by a prescribed wire (not shown), and thus, screw terminal 30C is electrically connected to semiconductor mounting substrate 10. Semiconductor device 1C according to the present embodiment may further include pin terminal 50 (see FIG. 1 or 2) as in the above first embodiment.

A prescribed notch is provided in the lid member in the present embodiment similarly to lid member 40A in the above first embodiment. This notch is provided corresponding to a desired position where screw terminal 30C and pin terminal 50 are secured to mother case 20.

Since the notch is provided in the lid member, the lid member can close opening 22 of mother case 20 with screw terminal 30C and pin terminal 50 secured to rim 24 of mother case 20.

As in the above first embodiment, screw terminal 30C secured to rim 24 of mother case 20 is bent substantially at a right angle such that flat plate portion 32 faces the upper surface of the lid member which closes opening 22. Opening 31 of flat plate portion 32 of screw terminal 30C and the nut are coaxially arranged.

Functions and Effects

In semiconductor device IC configured as described above, a prescribed external terminal (external terminal 72) is arranged on screw terminal 30C as in the above first embodiment. A screwing member (screwing member 70) such as a screw or a bolt is screwed into the nut (nut 45) through opening 31 of screw terminal 30C. The external terminal is secured to screw terminal 30C, and thus, the external terminal is electrically connected to semiconductor mounting substrate 10. In addition, another prescribed external terminal (not shown) is connected to the pin terminal, and thus, another external terminal is electrically connected to semiconductor mounting substrate 10.

According to semiconductor device 1C, screw terminal 30C and pin terminal 50 are secured to rim 24 of mother case 20. Screw terminal 30C is bent substantially at a right angle to face the upper surface (upper surface 42) of the lid member (lid member 40A).

The external terminal is secured to screw terminal 30C on the upper surface of the lid member. The position where the external terminal is secured to screw terminal 30C is on the inner side than rim 24 of mother case 20 in a plan view. In the present embodiment, the position of screw terminal 30C itself is also on the inner side than rim 24 of mother case 20 in a plan view. The position of block 60 itself is also on the inner side than rim 24 of mother case 20 in a plan view. According to semiconductor device 1C, the external terminal is secured on the upper surface of the lid member, and screw terminal 30C and block 60 do not protrude outward from mother case 20. According to semiconductor device 1C, the size of the entire device can be made smaller than that of the semiconductor device in Japanese Patent Laying-Open No. 2008-010656 described at the beginning.

According to semiconductor device IC, screw terminal 30C can be secured at desired securing position 25 in rim 24 of mother case 20, using block 60. According to semiconductor device 1C, the pin terminal (pin terminal 50) can also be secured at desired securing position 25 in rim 24 of mother case 20. Semiconductor device 1C can form various packages.

In semiconductor device 1A according to the above first embodiment, terminal bottom portion 36 is arranged between adjacent securing members 26. When a plurality of terminal bottom portions 36 are provided, the spacing between terminal bottom portions 36 must be equal to the spacing between securing members 26 (spacing P1 in FIG. 4) in order to secure screw terminal 30A to mother case 20. In other words, in semiconductor device 1A according to the first embodiment, the spacing between terminal bottom portions 36 is restricted to the spacing between securing members 26 (spacing P1 in FIG. 4).

According to semiconductor device 1C, spacing P1 (see FIG. 5) between insertion portions 66 of block 60 is equal to spacing P1 (see FIG. 4) between securing members 26 in order to secure screw terminal 30C and block 60 to mother case 20.

Spacing P2 (see FIG. 4) between terminal bottom portions 36 does not need to be equal to spacing P1 (see FIG. 4) between securing members 26 in order to secure screw terminal 30C and block 60 to mother case 20. In other words, in semiconductor device 1C according to the present embodiment, spacing P2 between terminal bottom portions 36 is not restricted to spacing P1 between securing members 26. According to semiconductor device 1C, the flexibility of layout of each terminal bottom portion 36 can be enhanced.

Although the example has been described in the present embodiment, where three terminal bottom portions 36 extend to branch from one flat plate portion 32, two or more terminal bottom portions 36 may extend from one flat plate portion 32.

Modification of Second Embodiment

Figure 7:
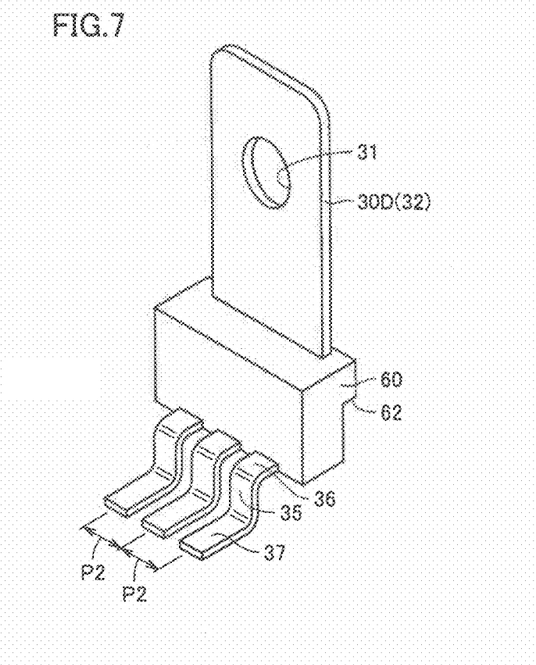
FIG. 7 is a perspective view of a screw terminal of a semiconductor device according to a modification of the second embodiment.

A semiconductor device according to a modification of the second embodiment will be described with reference to FIG. 7. The semiconductor device according to this modification is different from semiconductor device 1C according to the above second embodiment in terms of the following, and the former is substantially similar to the latter except for the following.

A screw terminal 30D of the semiconductor device according to this modification has extending portion 37 extending from terminal bottom portion 36, similarly to screw terminal 30B (see FIG. 3) in the modification of the above first embodiment. Extending portion 37 extends from terminal bottom portion 36 toward a semiconductor mounting substrate (semiconductor mounting substrate 10) with screw terminal 30D secured at a securing position (securing position 25). Extending portion 37 reaches a vicinity of a prescribed pad on the semiconductor mounting substrate.

Bent portion 35 may be provided between the tip of terminal bottom portion 36 and extending portion 37. Bent portion 35 extends to hang slightly forward (in the direction in which screw terminal 30D is bent) from the tip of terminal bottom portion 36. Extending portion 37 is connected to the tip of bent portion 35. Terminal bottom portion 36, bent portion 35 and extending portion 37 may have a substantially identical width.

In the semiconductor device according to this modification, extending portion 37 and the semiconductor mounting substrate are connected by soldering, and thus, screw terminal 30D is electrically connected to the semiconductor mounting substrate.

According to the semiconductor device in this modification, screw terminal 30D is electrically connected to the semiconductor mounting substrate by soldering similarly to screw terminal 30B (see FIG. 3) in the modification of the above first embodiment. Therefore, a larger current can flow through the semiconductor mounting substrate in the semiconductor device than in semiconductor device 1C according to the above second embodiment.

Third Embodiment

Figure 8:
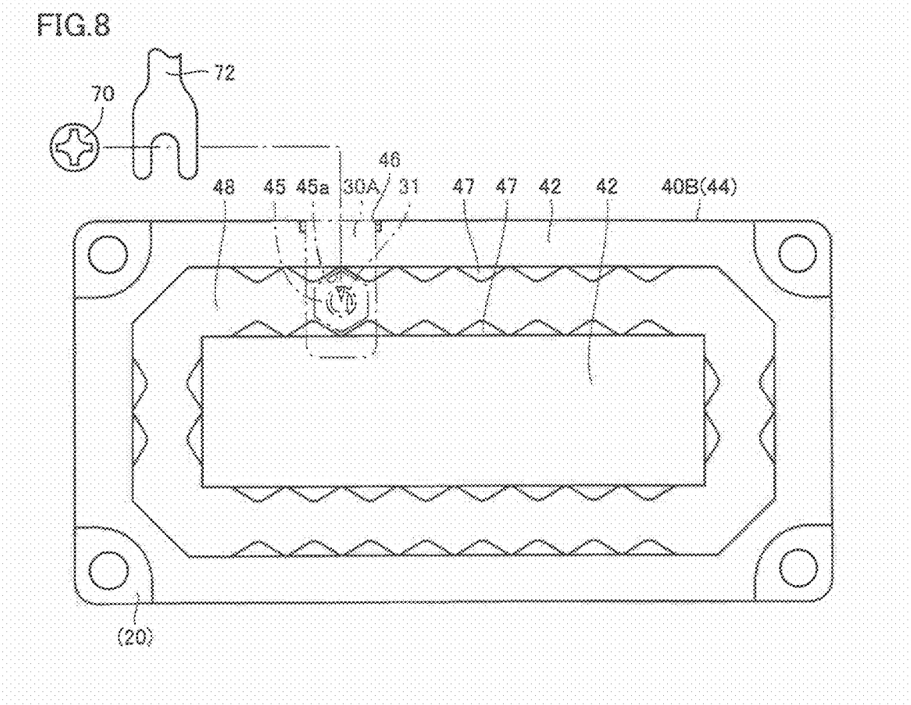
FIG. 8 is a plan view of a semiconductor device according to a third embodiment.

A semiconductor device according to the present embodiment will be described with reference to FIG. 8. The semiconductor device according to the present embodiment is different from the semiconductor device according to the above first embodiment, the semiconductor device according to the modification of the first embodiment, the semiconductor device according to the second embodiment, and the semiconductor device according to the modification of the second embodiment in terms of the following, and the semiconductor device according to the present embodiment is substantially similar to those semiconductor devices except for the following.

In the semiconductor device according to the present embodiment, a lid member 40B has accommodating groove 48 and a plurality of projections 47. Accommodating groove 48 is provided in upper surface 42 of lid member 40B annularly in a plan view. Accommodating groove 48 is recessed in the thickness direction of lid member 40B. Accommodating groove 48 accommodates nut 45 having a hexagonal shape in a plan view.

The plurality of projections 47 are provided side by side on an inner wall of accommodating groove 48. The plurality of projections 47 are each configured to have a shape of a triangular prism. The plurality of projections 47 may each be molded integrally with lid member 40B.

Screw terminal 30A is arranged along notch 46 and upper surface 42 of lid member 40B. Nut 45 is arranged to be coaxial with opening 31 of screw terminal 30A. Therefore, the plurality of projections 47 are provided, corresponding to the position where screw terminal 30A is arranged, to be capable of limiting movement and rotation of nut 45.

A spacing of the plurality of projections 47 in the present embodiment is set such that a top portion 45a of nut 45 is arranged between adjacent projections 47 with nut 45 accommodated by accommodating groove 48. Since top portion 45a of nut 45 is arranged between adjacent projections 47, the adjacent projections 47 can limit movement and rotation of nut 45 accommodated by accommodating groove 48. A spacing between adjacent projections 47 may be the same as or different from a spacing between another adjacent projections 47.

In the semiconductor device configured as described above, prescribed external terminal 72 is arranged on screw terminal 30A. Screwing member 70 such as a screw or a bolt is screwed into nut 45 through opening 31 of screw terminal 30A. External terminal 72 is secured to screw terminal 30A, and thus, external terminal 72 is electrically connected to a semiconductor mounting substrate (not shown).

According to the semiconductor device in the present embodiment, projections 47 limit movement and rotation of nut 45. Screwing member 70 can be readily screwed into nut 45 without securing nut 45 by a spanner and the like. External terminal 72 can be readily connected to screw terminal 30A.

Fourth Embodiment

Figure 9:
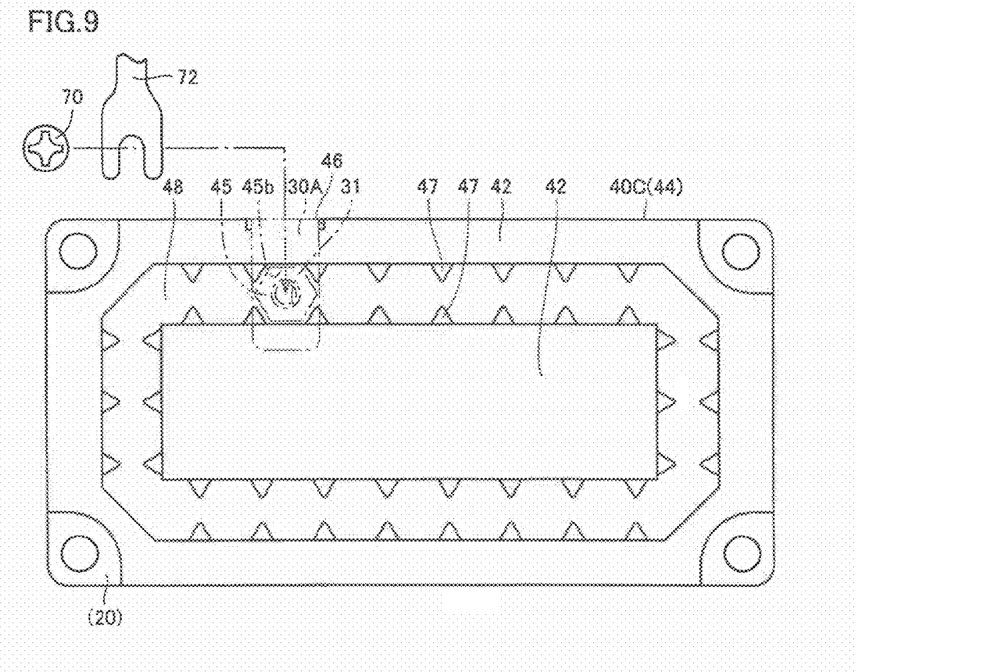
FIG. 9 is a plan view of a semiconductor device according to a fourth embodiment.

A semiconductor device according to the present embodiment will be described with reference to FIG. 9. The semiconductor device according to the present embodiment is different from the semiconductor device according to the above first embodiment, the semiconductor device according to the modification of the first embodiment, the semiconductor device according to the second embodiment, and the semiconductor device according to the modification of the second embodiment in terms of the following, and the semiconductor device according to the present embodiment is substantially similar to those semiconductor devices except for the following.

In the semiconductor device according to the present embodiment, a lid member 40C has accommodating groove 48 and the plurality of projections 47. Accommodating groove 48 is provided in upper surface 42 of lid member 40C annularly in a plan view. Accommodating groove 48 is recessed in the thickness direction of lid member 40C. Accommodating groove 48 accommodates nut 45 having a hexagonal shape in a plan view.

The plurality of projections 47 are provided side by side on the inner wall of accommodating groove 48. The plurality of projections 47 are each configured to have a shape of a triangular prism. The plurality of projections 47 may be molded integrally with lid member 40C.

Screw terminal 30A is arranged along notch 46 and upper surface 42 of lid member 40C. Nut 45 is arranged to be coaxial with opening 31 of screw terminal 30A. Therefore, the plurality of projections 47 are provided, corresponding to the position where screw terminal 30A is arranged, to be capable of limiting movement and rotation of nut 45.

A spacing of the plurality of projections 47 in the present embodiment is set such that a side portion 45b of nut 45 is arranged between adjacent projections 47 with nut 45 accommodated by accommodating groove 48. Since side portion 45b of nut 45 is arranged between adjacent projections 47, the adjacent projections 47 can limit movement and rotation of nut 45 accommodated by accommodating groove 48. A spacing between adjacent projections 47 may be the same as or different from a spacing between another adjacent projections 47.

In the semiconductor device configured as described above, prescribed external terminal 72 is arranged on screw terminal 30A. Screwing member 70 such as a screw or a bolt is screwed into nut 45 through opening 31 of screw terminal 30A. External terminal 72 is secured to screw terminal 30A, and thus, external terminal 72 is electrically connected to a semiconductor mounting substrate (not shown).

According to the semiconductor device in the present embodiment, projections 47 limit movement and rotation of nut 45. Screwing member 70 can be readily screwed into nut 45 without securing nut 45 by a spanner and the like. External terminal 72 can be readily connected to screw terminal 30A.

Fifth Embodiment

A semiconductor device according to the present embodiment will be described with reference to FIGS. 10 and 11. The semiconductor device according to the present embodiment is different from the semiconductor device according to the above first embodiment, the semiconductor device according to the modification of the first embodiment, the semiconductor device according to the second embodiment, and the semiconductor device according to the modification of the second embodiment in terms of the following, and the semiconductor device according to the present embodiment is substantially similar to those semiconductor devices except for the following.

Figure 10:
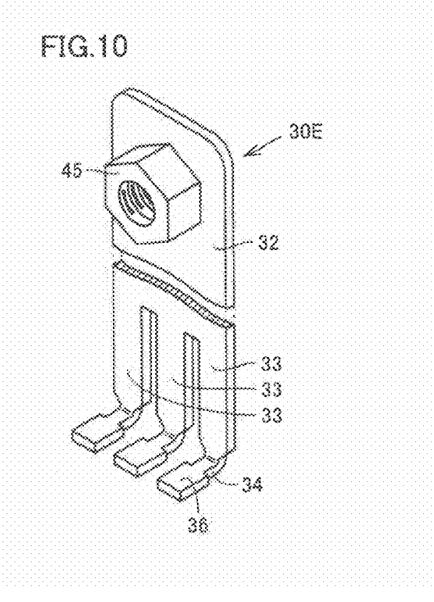
FIG. 10 is a perspective view of a screw terminal of a semiconductor device according to a fifth embodiment.

Referring to FIG. 10, in the semiconductor device according to the present embodiment, nut 45 having a hexagonal shape in a plan view, for example, is joined to a screw terminal 30E by welding and the like. Nut 45 is joined to a surface of flat plate portion 32 to be coaxial with opening 31 (see FIG. 11) of screw terminal 30E. Nut 45 is joined to the surface of flat plate portion 32 on the side where screw terminal 30E is bent. Screw terminal 30E may include a block (block 60) as in the second embodiment and the modification of the second embodiment.

Figure 11:
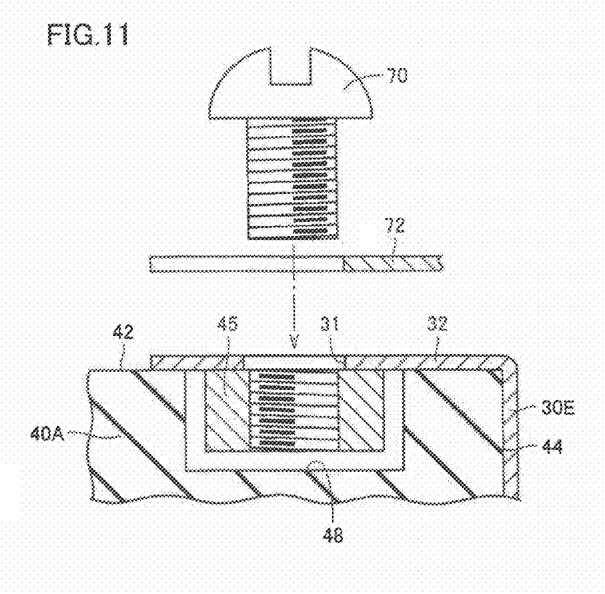
FIG. 11 is a cross-sectional view of the screw terminal and a lid member of the semiconductor device according to the fifth embodiment.

Referring to FIG. 11, screw terminal 30E is bent substantially at a right angle such that flat plate portion 32 faces upper surface 42 of lid member 40A. Therefore, lid member 40A may have accommodating groove 48 that can accommodate nut 45.

In the semiconductor device configured as described above, prescribed external terminal 72 is arranged on screw terminal 30A. Screwing member 70 such as a screw or a bolt is screwed into nut 45 through opening 31 of screw terminal 30E. External terminal 72 is secured to screw terminal 30E, and thus, external terminal 72 is electrically connected to a semiconductor mounting substrate (not shown).

According to the semiconductor device in the present embodiment, nut 45 is joined to screw terminal 30E. Screwing member 70 can be readily screwed into nut 45 without securing nut 45 by a spanner and the like. External terminal 72 can be readily connected to screw terminal 30E.

Sixth Embodiment

A semiconductor device according to the present embodiment will be described with reference to FIGS. 12 and 13. The semiconductor device according to the present embodiment is different from the semiconductor device according to the above first embodiment, the semiconductor device according to the modification of the first embodiment, the semiconductor device according to the second embodiment, and the semiconductor device according to the modification of the second embodiment in terms of the following, and the semiconductor device according to the present embodiment is substantially similar to those semiconductor devices except for the following.

Figure 12:
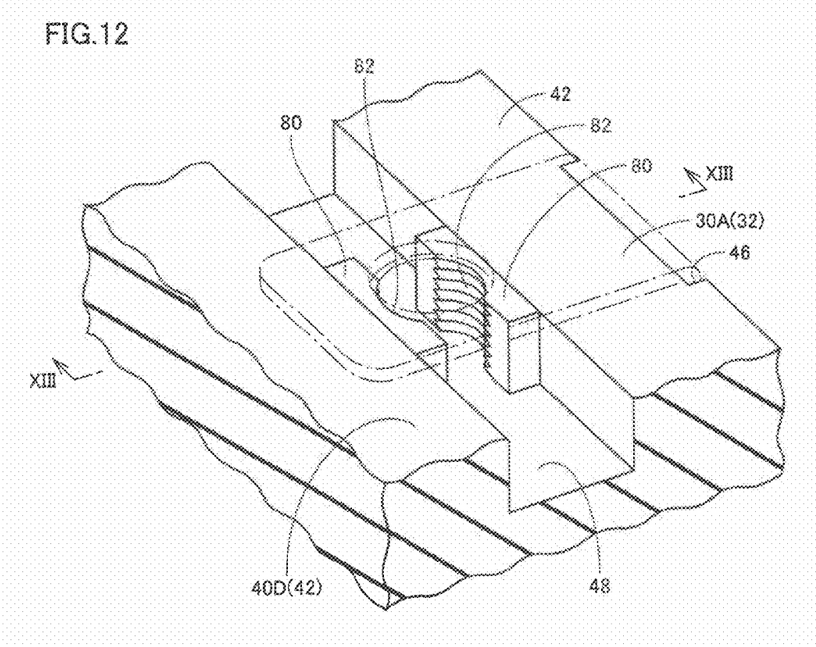
FIG. 12 is a perspective view of a part (a lid member, a screw terminal and a flat plate-like member) of a semiconductor device according to a sixth embodiment.

Referring to FIG. 12, the semiconductor device according to the present embodiment further includes two flat plate-like members 80. Two flat plate-like members 80 face each other at a prescribed spacing. A lid member 40D has accommodating groove 48 that can accommodate two flat plate-like members 80 facing each other. Accommodating groove 48 is formed in upper surface 42.

Two flat plate-like members 80 are each provided with a thread groove 82 on an opposing surface thereof. Respective thread grooves 82 formed in two flat plate-like members 80 form one female thread. Screw terminal 30A is bent substantially at a right angle such that flat plate portion 32 faces upper surface 42 of lid member 40D. Screw terminal 30A is arranged along notch 46 and upper surface 42 of lid member 40D. Therefore, two flat plate-like members 80 are arranged such that thread grooves 82 (one female thread described above) are coaxial with opening 31 of screw terminal 30A.

Figure 13:
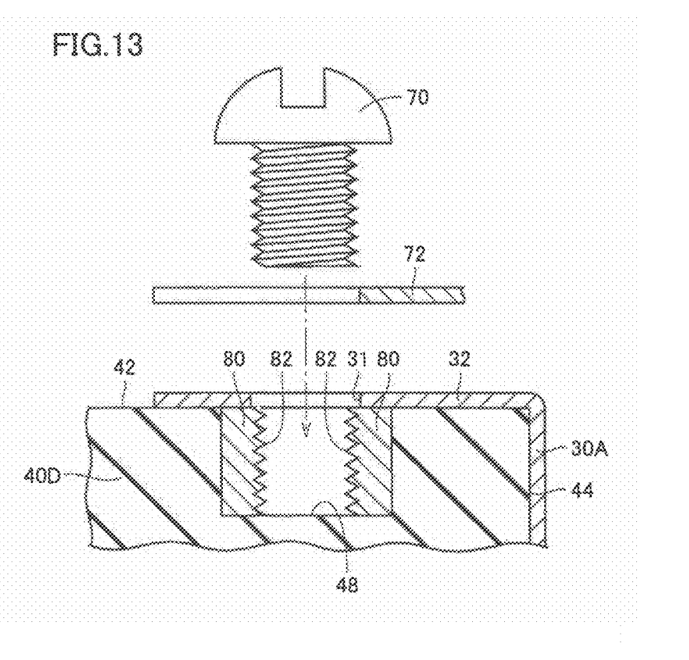
FIG. 13 is a cross-sectional view taken along line XIII-XIII in FIG. 12.

Referring to FIG. 13, two flat plate-like members 80 may be bonded to accommodating groove 48. Two flat plate-like members 80 may be molded (insert-molded) integrally with lid member 40D. When flat plate-like members 80 are non-conductive, a plurality of thread grooves 82 may be formed side by side (in the longitudinal direction of flat plate-like members 80) in two flat plate-like members 80. Screw terminal 30A may include a block (block 60) as in the second embodiment and the modification of the second embodiment.

In the semiconductor device configured as described above, prescribed external terminal 72 is arranged on screw terminal 30A. Screwing member 70 such as a screw or a bolt is fitted into thread groove 82 through opening 31 of screw terminal 30A. External terminal 72 is secured to screw terminal 30A, and thus, external terminal 72 is electrically connected to a semiconductor mounting substrate (not shown).

According to the semiconductor device in the present embodiment, the position of two flat plate-like members 80 and the position of thread groove 82 can be set at a desired position in accommodating groove 48. External terminal 72 can be connected to screw terminal 30A, corresponding to the desired position of screw terminal 30A.

When two flat plate-like members 80 are bonded to accommodating groove 48, movement and rotation of flat plate-like members 80 are limited, and thus, screwing member 70 can be readily fitted into thread groove 82. External terminal 72 can be readily connected to screw terminal 30A.

When two flat plate-like members 80 are molded (insert-molded) integrally with lid member 40D, movement and rotation of flat plate-like members 80 are also limited, and thus, screwing member 70 can be readily fitted into thread groove 82. External terminal 72 can be readily connected to screw terminal 30A.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
a semiconductor mounting substrate;
a mother case having an opening and housing said semiconductor mounting substrate;
a plurality of securing members provided along a rim of said mother case constituting said opening;
a screw terminal having a flat plate portion, an insertion portion extending from said flat plate portion, and a terminal bottom portion located opposite to said flat plate portion with said insertion portion interposed between said terminal bottom portion and said flat plate portion, secured to said securing members by insertion of said insertion portion between adjacent said securing members, and electrically connected to said semiconductor mounting substrate on said terminal bottom portion side; and
a lid member capable of closing said opening with said screw terminal secured to said securing members, the lid member includes an accommodating groove provided in an upper surface of the lid member annularly in a plan view and is configured to accommodate a plurality of nuts, wherein
said screw terminal secured to said securing members is bent such that said flat plate portion faces an upper surface of said lid member closing said opening.

2. The semiconductor device according to claim 1, wherein said screw terminal has an extending portion extending from said terminal bottom portion toward said semiconductor mounting substrate.

3. The semiconductor device according to claim 1, wherein said lid member has
an accommodating groove provided in said upper surface and capable of accommodating a nut having a hexagonal shape in a plan view, and
a plurality of projections provided on an inner wall of said accommodating groove, for limiting movement and rotation of said nut, and
a spacing between adjacent said projections is set such that a top portion of said nut is located between adjacent said projections.

4. The semiconductor device according to claim 1, wherein said lid member has
an accommodating groove provided in said upper surface and capable of accommodating a nut having a hexagonal shape in a plan view, and
a plurality of projections provided on an inner wall of said accommodating groove, for limiting movement and rotation of said nut, and
a spacing between adjacent said projections is set such that a side portion of said nut is located between adjacent said projections.

5. The semiconductor device according to claim 1, wherein a nut communicating with an opening provided in said flat plate portion is joined to said screw terminal.

6. The semiconductor device according to claim 1, wherein said lid member has an accommodating groove in said upper surface, and said accommodating groove is provided with two flat plate-like members facing each other at a prescribed spacing and each having a thread groove on an opposing surface.

7. A semiconductor device, comprising:
a semiconductor mounting substrate;
a mother case having an opening and housing said semiconductor mounting substrate;
a plurality of securing members provided along a rim of said mother case constituting said opening;
a block having an insertion portion and secured to said securing members by insertion of said insertion portion between adjacent said securing members;
a screw terminal configured to include a flat plate portion and a plurality of terminal bottom portions extending from said flat plate portion, provided to pass through said block and held by said block, and electrically connected to said semiconductor mounting substrate on said plurality of terminal bottom portions side; and
a lid member capable of closing said opening with said block secured to said securing members, the lid member includes an accommodating groove provided in an upper surface of the lid member annularly in a plan view and is configured to accommodate a plurality of nuts, wherein
said screw terminal is bent such that said flat plate portion faces an upper surface of said lid member closing said opening, with said block secured to said securing members.

* * * * *